United States Patent
Hirose et al.

(10) Patent No.: US 7,010,826 B2
(45) Date of Patent: Mar. 14, 2006

(54) SUBSTRATE CLEANING TOOL AND SUBSTRATE CLEANING APPARATUS

(75) Inventors: Keizo Hirose, Nirasaki (JP); Kenji Sekiguchi, Nirasaki (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 09/960,413

(22) Filed: Sep. 24, 2001

(65) Prior Publication Data

US 2002/0035763 A1 Mar. 28, 2002

(30) Foreign Application Priority Data

Sep. 22, 2000 (JP) .............................. 2000-288407

(51) Int. Cl.
 *B08B 1/04* (2006.01)
(52) U.S. Cl. ............................ 15/77; 15/88.2; 15/88.1; 15/102
(58) Field of Classification Search .................... 15/77, 15/88.2, 102, 207.2, 205.2, 21.1, 29, 229.1–229.9, 15/230.16, 230, 88.1, 53.2–53.3, 211; 401/183, 401/286, 28, 268; 428/398, 357; 420/398, 420/357; 210/321.79, 321.8, 321.88, 321.89, 210/321.69
See application file for complete search history.

(56) References Cited

U.S. PATENT DOCUMENTS

| | | | | |
|---|---|---|---|---|
| 1,930,044 A | * | 10/1933 | Farquhar | 15/227 |
| 3,750,213 A | * | 8/1973 | Hansen | 15/53.3 |
| 3,827,099 A | * | 8/1974 | Allaire et al. | 15/229.1 |
| 4,039,261 A | * | 8/1977 | Evans | 401/132 |
| 4,066,366 A | * | 1/1978 | Reynolds | 401/285 |
| 4,323,085 A | * | 4/1982 | Rohm | 132/113 |
| 4,730,361 A | * | 3/1988 | Koffler | 15/160 |
| 4,958,596 A | * | 9/1990 | Belan | 119/603 |
| 5,858,112 A | * | 1/1999 | Yonemizu et al. | 134/6 |
| 6,115,867 A | * | 9/2000 | Nakashima et al. | 15/77 |
| 6,126,530 A | * | 10/2000 | Hirata | 451/444 |
| 6,131,233 A | * | 10/2000 | Bolton et al. | 15/229.1 |
| 6,175,983 B1 | * | 1/2001 | Hirose et al. | 15/102 |
| 6,308,361 B1 | * | 10/2001 | Matsuda et al. | 15/102 |
| 6,464,796 B1 | * | 10/2002 | Vail et al. | 134/6 |
| 6,554,010 B1 | * | 4/2003 | Hirose et al. | 134/153 |

FOREIGN PATENT DOCUMENTS

JP 08-241880 9/1996

* cited by examiner

*Primary Examiner*—John Kim
*Assistant Examiner*—Shay L. Balsis
(74) *Attorney, Agent, or Firm*—Smith, Gambrell & Russell, LLP

(57) ABSTRACT

A substrate cleaning tool having little particle sticking to the tool and a substrate cleaning apparatus having the substrate cleaning tool are provided. The substrate cleaning tool 23 has a plurality of thready brush members 46 in a bundle. The brush members 46 are capable of passing cleaning liquid through and ejecting the cleaning liquid through respective surfaces of the members 46. In operation, the substrate cleaning tool 23 is brought into contact with a substrate W in their relative movement in order to clean the substrate W. As the cleaning liquid is ejected from the surfaces of the brash members 46, particles are washed away from the surfaces of the brash members 46. Consequently, it is possible to eliminate a possibility that the particles etc. are transferred to the substrate W.

13 Claims, 9 Drawing Sheets

SUBSTRATE CLEANING TOOL AND SUBSTRATE CLEANING APPARATUS

BACKGROUND OF THE INVENTION

1. Field of the Invention

The present invention relates to a substrate cleaning tool and a substrate cleaning apparatus for cleaning a substrate, for example, semiconductor wafer, LCD substrate glass, etc.

2. Description of the Related Art

The manufacturing process for semiconductor devices requires maintaining the cleanilyness of semiconductor wafers on which the semiconductor devices are built. Note, the semiconductor wafers will be shortened to "wafers", hereinafter. Accordingly, before and after respective manufacturing and application processes and also after film deposition and polishing processes, the wafers are cleaned by the substrate cleaning apparatus.

In the above substrate cleaning apparatus, generally, a brush is pressed on the wafer in their relative movement to remove particle contaminants off the wafer. Hitherto, there has been employed a combination-type brush composed of brush elements of PVD (polyvinyl alcohol) and rigid nylon hairs. In operation, for example, the whole wafer is cleaned uniformly by reciprocating the brush between the center of the rotating wafer and the periphery.

In the conventional substrate cleaning apparatus, however, there still remains a possibility that the particles are left on the wafer after cleaning process since the particles, such as particle contaminants, are easy to adhere to the brush and therefore transferred to the wafer. To the contrary, the removal of particles transferred as above requires frequent cleaning of the brush to take a long time for cleaning process. Consequently, the elongated cleaning period causes the brush to be deteriorated with troublesome maintenance due to replacement of the brush, etc.

SUMMARY OF THE INVENTION

Under such a situation, the object of the invention is to provide a substrate cleaning tool having little particle sticking thereto and also a substrate cleaning apparatus equipped with the substrate cleaning tool.

The first feature of the present invention resides in the provision of a substrate cleaning tool for cleaning a substrate, comprising a plurality of thready brush members in a bundle, the brush members having channels formed therein for passage of cleaning liquid. The second feature of the invention resides in that the brush members are capable of ejecting the cleaning liquid through respective surfaces of the brush members.

According to the first and second features of the invention, the cleaning operation is performed by making the substrate cleaning tool contact with the substrate while allowing the cleaning liquid to pass through the channels in the thready brush members and further moving the substrate and the substrate cleaning tool relatively. Then, since the cleaning liquid flowing through the channels is spouted out through the surfaces of the brush members, contaminants (e.g. particles) on the substrate are washed away from the surfaces of the brush members, that is, producing a difficulty for the particles to stick to the cleaning body (tool). Thus, it is possible to prevent an indirect transferal (i.e. re-sticking) of the contaminants, such as particles, from the substrate to the substrate. Accordingly, the cleaning efficiency can be improved to shorten the cleaning period. With this reduction in cleaning period, it is possible to elongate the product life of the substrate cleaning tool.

The third feature of the invention resides in that the substrate cleaning tool is adapted so as to rotate against a substrate to be cleaned.

The fourth feature of the invention resides in that the brush members are made of water permeable material and also shaped to be hollow.

The fifth feature of the invention resides in that the brush members have a number of channels for passage of the cleaning liquid.

The sixth feature of the invention resides in that the brush members are formed so as to be water-repellent. With this feature, it is possible to repel the particles, which have been peeled off the substrate by the cleaning operation, together with the cleaning liquid, making it more difficult that the particles stick to the brush members.

The seventh feature of the invention resides in that the brush members are formed so as to be intimate with water.

The eighth feature of the invention resides in that the brush members have their respective one ends tied up in a bundle.

The ninth feature of the invention resides in that the brush members extend straight.

The 10th feature of the invention resides in that the brush members have long elements and short elements.

The 11th. feature of the invention resides in that the brush members have their respective both ends tied up in a bundle and also make loops.

The 12th. feature of the invention resides in the provision of a substrate cleaning tool for cleaning a substrate, comprising a plurality of thready brush members in a bundle, the brush members being formed so as to be water-repellent. According to the 12th. feature of the invention, it is performed to make the bundled "thready" brush members contact with the substrate that the cleaning liquid is supplied by e.g. a nozzle etc. Further, by moving the substrate and the substrate cleaning tool relatively, the cleaning operation is completed. Hereat, since the brush members are water-repellent, it is possible to repel the particles, which have been peeled off the substrate by the cleaning operation, together with the cleaning liquid, thereby making it difficult that the particles stick to the brush members. Thus, there is little worry that the particles are transferred from the brush members to the substrate, whereby the cleaning efficiency can be improved to shorten the cleaning period. With this reduction in cleaning period, it is possible to elongate the product life of the substrate cleaning tool.

The 13th. feature of the invention resides in the provision of a substrate cleaning apparatus comprising:
  a substrate cleaning tool having a plurality of thready brush members in a bundle, the brush members having channels formed therein for passage of cleaning liquid;
  a scrub arm for holding the substrate cleaning tool; and
  a holder for holding a substrate to be cleaned by the substrate cleaning tool. According to this feature of the invention, the substrate can be cleaned in a short time. Additionally, with the installation of the substrate cleaning tool having a long product life, it is possible to elongate the cycle of maintenance, such as exchange of components, in the substrate cleaning apparatus.

The 14th. feature of the invention resides in that the scrub arm is provided with a cleaner driving mechanism for driving the substrate cleaning tool.

The 15th. feature of the invention resides in that the cleaner driving mechanism moves the substrate cleaning tool up and down.

The 16th. feature of the invention resides in that the cleaner driving mechanism rotates the substrate cleaning tool.

The 17th. feature of the invention resides in that the cleaner driving mechanism moves the substrate cleaning tool up and down and also rotates the substrate cleaning tool.

The 18th. feature of the invention resides in that the holder holds the substrate rotatably.

The 19th. feature of the invention resides in that the substrate cleaning apparatus further comprises a nozzle for ejecting cleaning liquid for rinsing.

DESCRIPTION OF THE PREFERRED EMBODIMENTS

Figure 1:
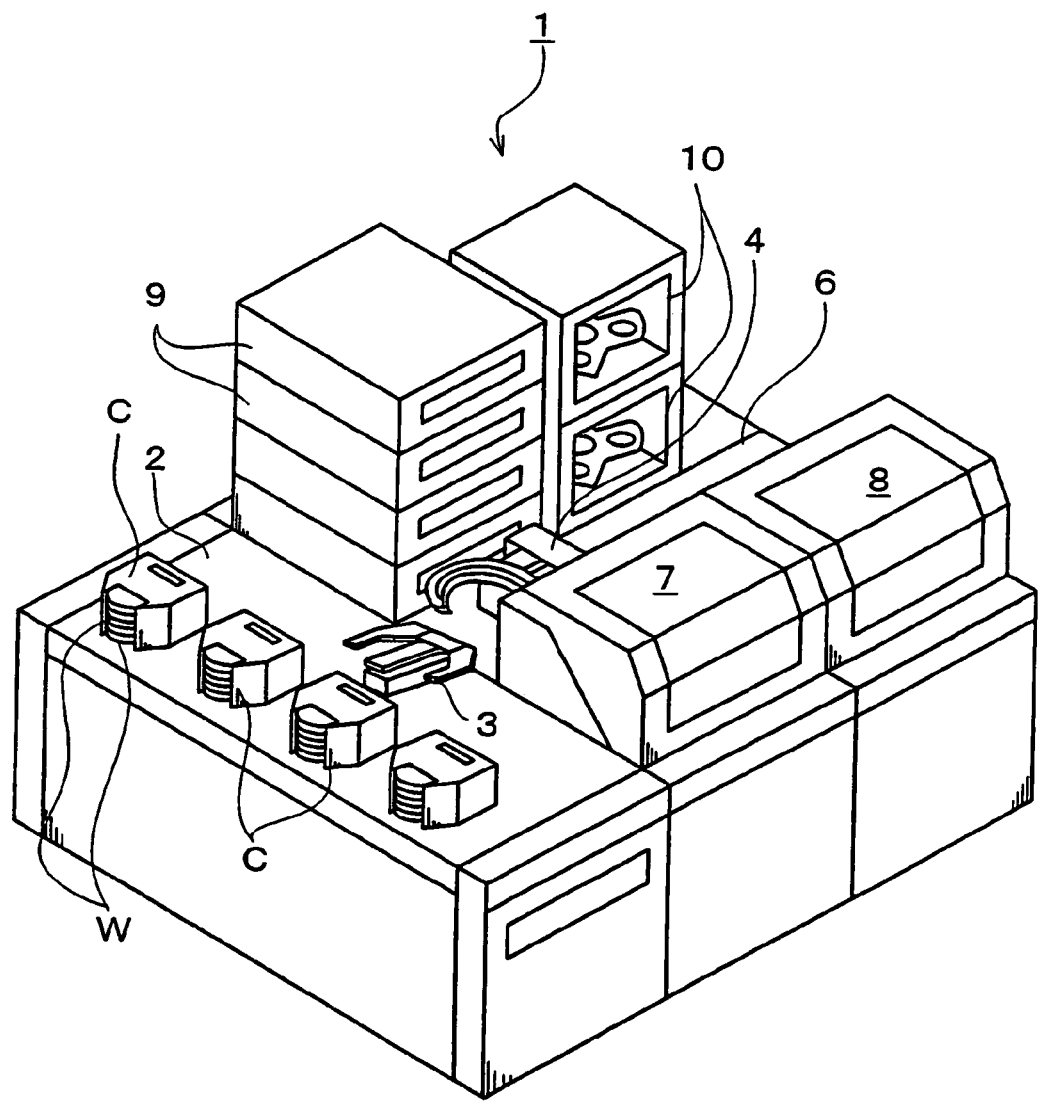
FIG. 1 is a perspective view of a cleaning system having a substrate cleaning apparatus in accordance with an embodiment of the present invention.

With reference to the attached drawings, we now describe one preferred embodiment where the present invention is applied to a cleaning apparatus constructed so as to clean the back surface of a wafer as one example of the substrate. FIG. 1 is a perspective view of a cleaning system 1 having a built-in substrate cleaning apparatus 8 of this embodiment. In this cleaning system 1, wafers W are loaded in blocks of carriers C. Subsequently, the wafers Ware cleaned and dried one by one and the cleaned wafers W are unloaded in blocks of the carrier finally.

The cleaning system 1 is provided with a mount section 2 capable of mounting four carriers C thereon, the carriers C each having the wafers W accommodated therein. At the center of the cleaning system 1, a manipulating arm 3 is arranged to pick up the uncleaned wafers W one by one from the carrier C mounted on the mount section 2 and also accommodate the cleaned wafers W into the carrier C. Behind the manipulating arm 3, a transfer arm 4 stands ready to give and receive the wafers W to and from the arm 3. The transfer arm 4 is movable along a transfer line 6 extending through the center of the cleaning system 1. On both sides of the transfer line 6, there are arranged respective processing apparatuses for performing a variety of processes. For example, on one side of the transfer line 6, a substrate cleaning apparatus 7 for cleaning the front faces of the wafers W and a substrate cleaning apparatus 8 for cleaning the back faces of the wafers W are juxtaposed side by side. On the other side of the transfer line 6, four heater units 9 are stacked up to heat the wafers W for dry. Adjoining the heater units 9, two reversing units 10 are stacked up to turn over the front and back faces of the wafer W. Note, the front face of each wafer W assumes a mirror-finished surface on which, for example, semiconductor devices are built. While, the back face of the wafer W is finished roughly.

Figure 2:
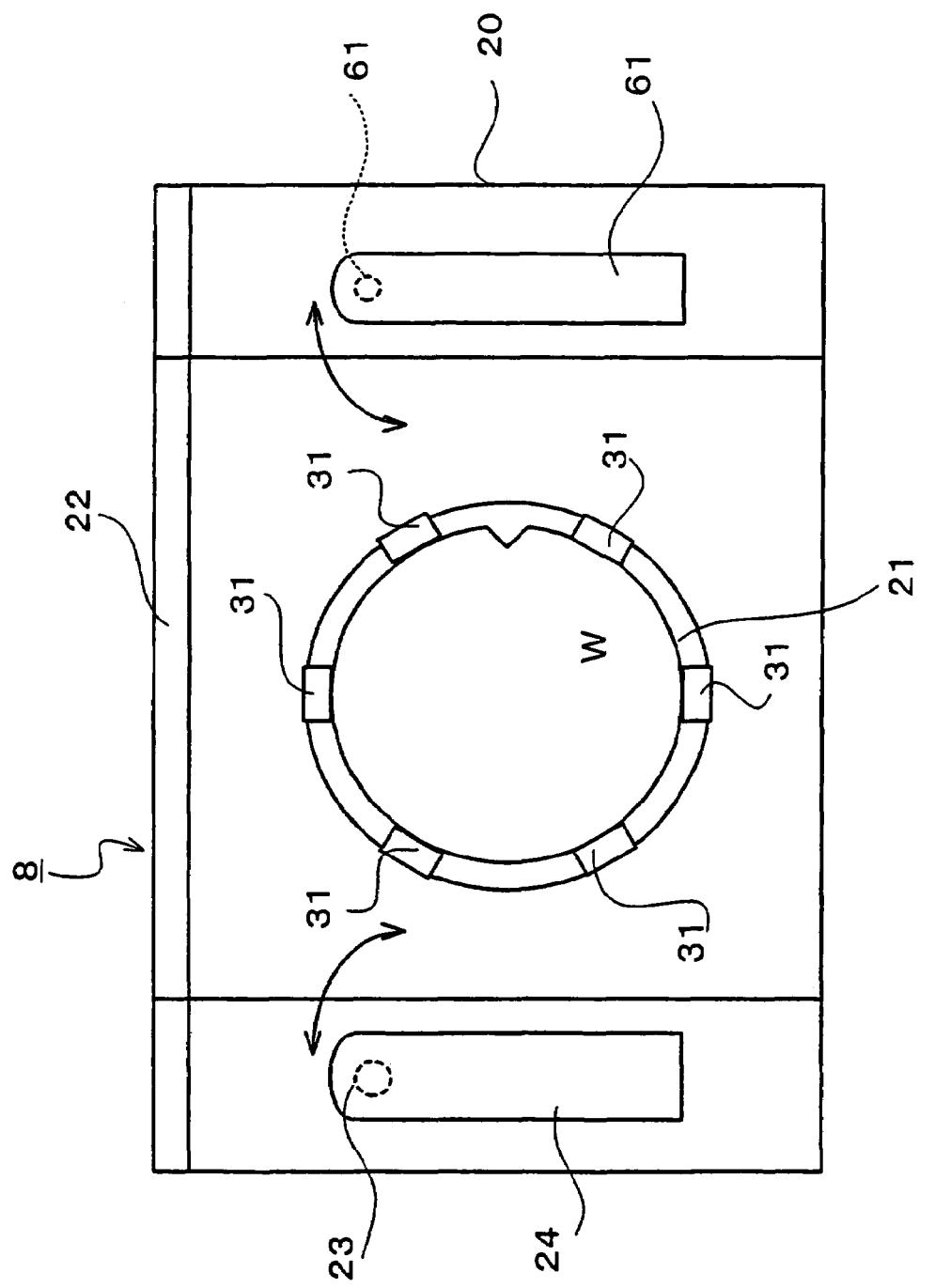
FIG. 2 is a plan view of the substrate cleaning apparatus of the embodiment of the present invention.
Figure 3:
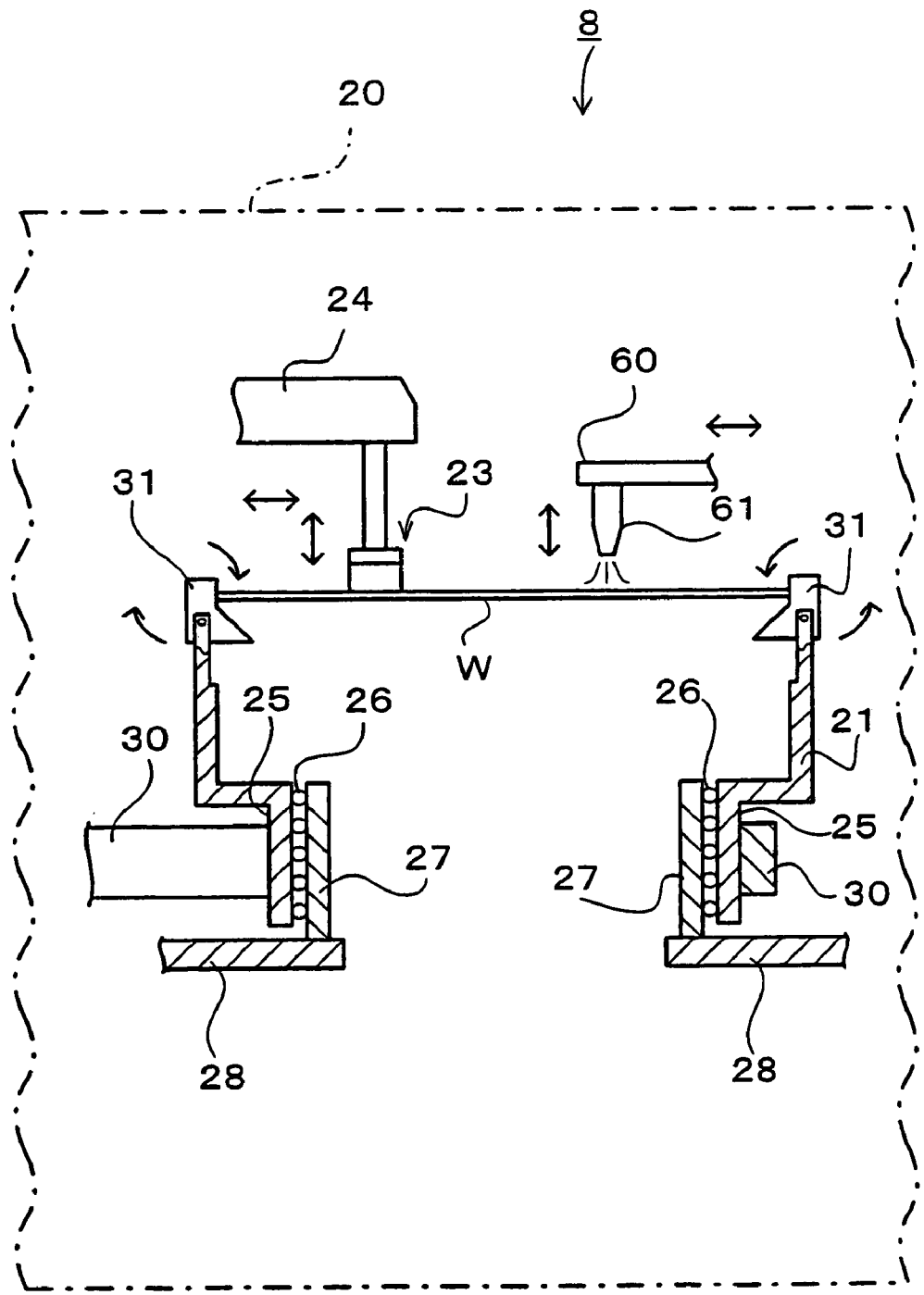
FIG. 3 is a longitudinal sectional view of the substrate cleaning apparatus of the embodiment of the present invention.

The structure of the substrate cleaning apparatus 8 will be described. FIG. 2 is a plan view of the substrate cleaning apparatus 8 and FIG. 3 is a longitudinal sectional view of the same apparatus 8. As shown in FIGS. 2 and 3, the substrate cleaning apparatus 8 has a spin chuck 21 arranged in a casing 20 to support the wafer W rotatably. In this apparatus 8, the spin chuck 21 holds the wafer W that has been postured so as to have its back face directing upward, by the reversing unit 10. The casing 20 is provided, on a front side thereof (on the side of the transfer line 6 in the cleaning system 1 of FIG. 1), with a closing/opening shutter 22 which opens when loading and unloading the wafer W to and from the substrate cleaning apparatus 8 through the transfer arm 4.

In the embodiment, the spin chuck 21 is in the form of a cylindrical rotating body. The spin chuck 21 is provided, on its lower portion, with a shrinking part 25 in comparison with the upper portion. The shrinking part 25 is fitted to the outside of a cylinder 27 through a bearing mechanism 26, so that the whole spin chuck 21 is rotatably supported by the cylinder 27. The cylinder 27 is fixed on an upper face of a horizontal fixing plate 28. A belt 30 is wound around the outer periphery of the shrinking part 25. The belt 30 is driven by a not-shown motor to rotate the whole spin chuck 21.

On the top of the spin chuck 21, holding members 31 are fitted to hold the periphery of the wafer W at several positions. The respective holding members 31 are adapted so as to be rotatable about horizontal axes with respect to the spin chuck 21. Since each of the holding members 31 is equipped with a not-shown weight, the centrifugal force resulting from the rotation of the spin chuck 21 allows the upper part of each holding member 31 to be move inward thereby to hold the periphery of the wafer W from its outside.

On both sides of the spin chuck 21, there are arranged a scrub arm 24 and a nozzle arm 60. A scrub cleaner 23 is fitted to the underside of a leading end of the scrub arm 24, as a substrate cleaning tool for cleaning the back face of the wafer W. Owing to the pivotal movement of the scrub arm 24, the scrub cleaner 23 is capable of reciprocating from an external position outside the spin chuck 21 to the substantial center of the wafer W held by the spin chuck 21 and vice versa. Note, FIG. 2 shows a stand-by condition that results from the moving the cleaner 23 to the outside of the spin chuck 23 due to the pivotal motion of the scrub arm 24, while FIG. 3 shows a cleaning condition that results from the moving the cleaner 23 to the upside of the wafer W held by the spin chuck 23 due to the pivotal motion of the scrub arm 24.

Figure 4:
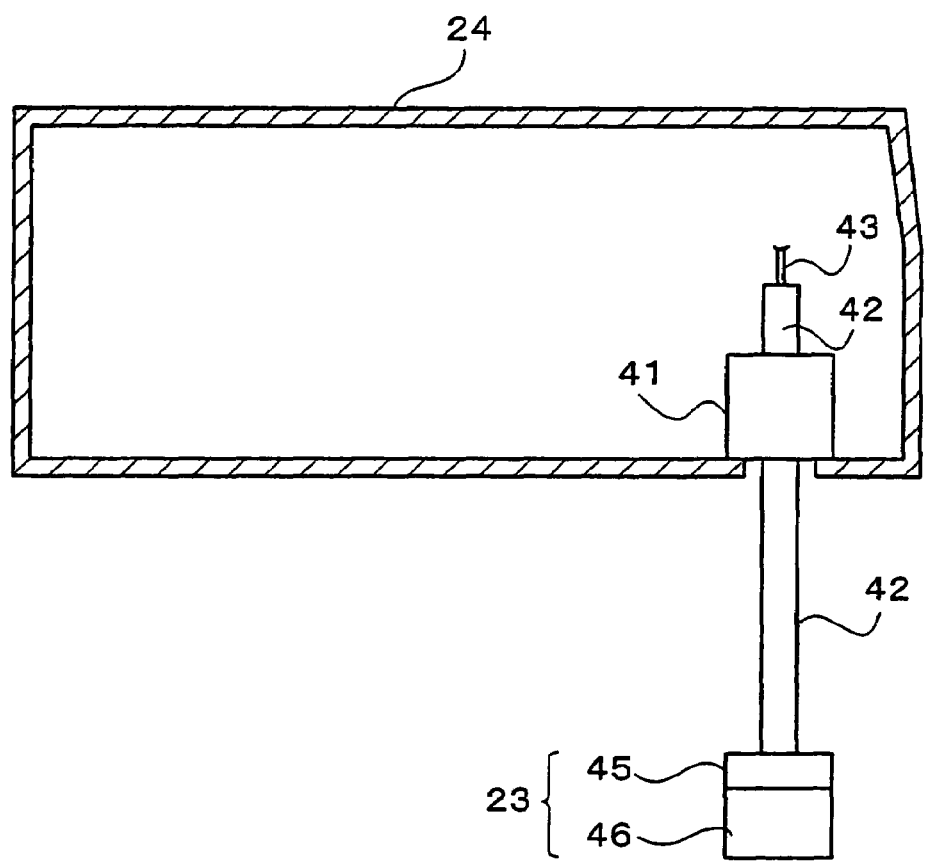
FIG. 4 is a longitudinal sectional view schematically showing the structure of a scrub arm.

As shown in FIG. 4, an elevating-and-rotating mechanism 41 is arranged in the scrub arm 24 to rotate and move the scrub cleaner 23 up and down. An elevator shaft 42 of rotation penetrates the elevating-and-rotating mechanism 41. The scrub cleaner 23 is attached to the lower end of the elevator shaft 42. With the drive of the mechanism 41, the scrub cleaner 23 is capable of moving up and down and rotating about the elevator shaft 42. When the elevatingand-rotating mechanism 41 applies a downward thrust on the elevator shaft 42 appropriately, the scrub cleaner 23 is pressed on the back face of the wafer W retained in the spin chuck 21, with an optional contact pressure.

Figure 5:
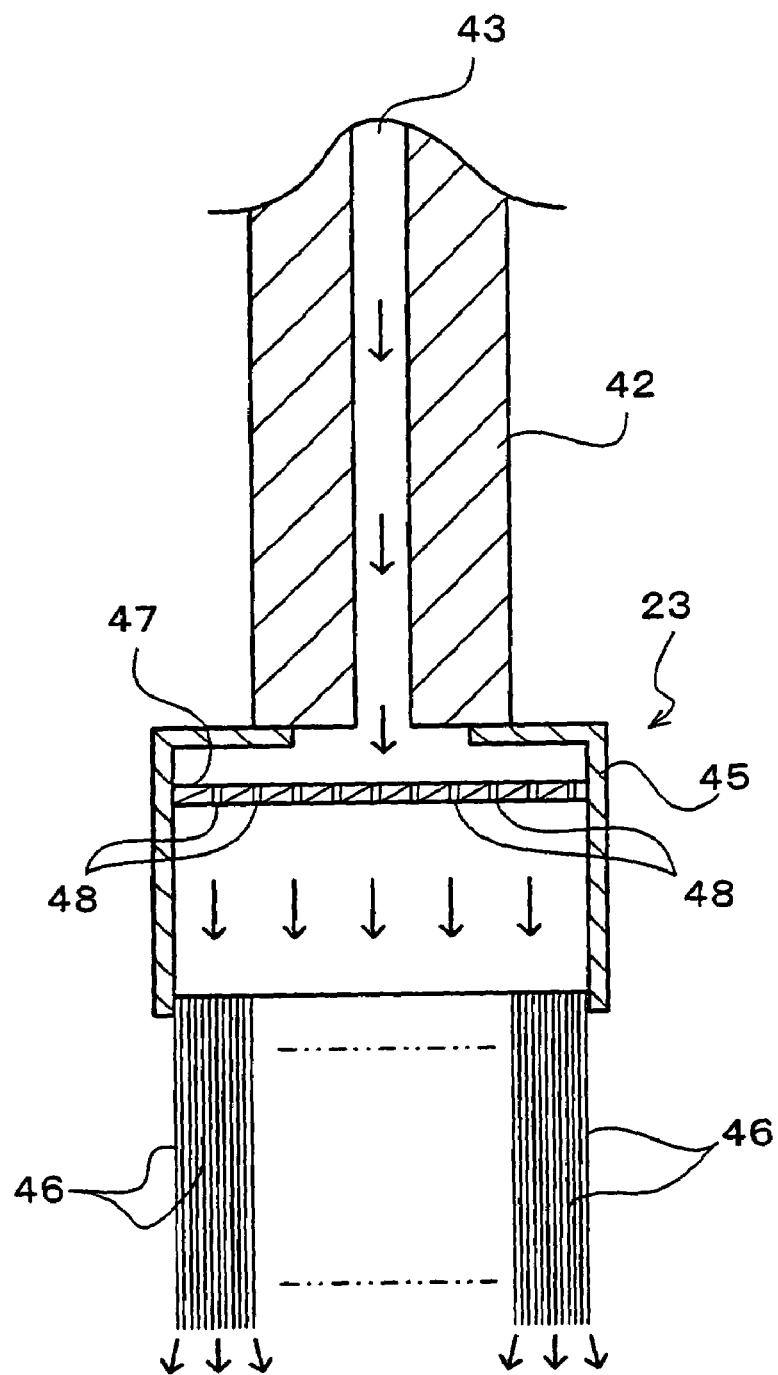
FIG. 5 is a longitudinal sectional view showing the schematic structure of a scrub-cleaning tool of the embodiment of the present invention.

For supply of cleaning liquid, such as pure water, a cleaning liquid passage 43 is formed to penetrate the interior of the elevator shaft 42, allowing the scrub cleaner 23 to be supplied with the cleaning liquid through the interior of the elevator shaft 42. As shown in FIG. 5, the scrub cleaner 23 has a column body 45 and a plurality of brush members 46 attached to the lower face of the body 45 and also tied up in a bundle. The column body 45 is hollow-shaped and also provided with a horizontal diffuser plate 47. The cleaning liquid supplied to the interior of the body 45 via the above passage 43 passes through a plurality of holes 48, allowing the uniform supply of the cleaning liquid toward the brush members 46 from their upside.

Figure 6:
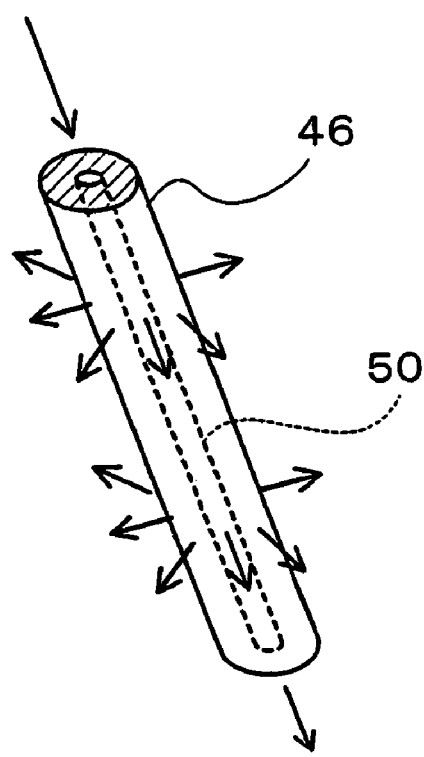
FIG. 6 is a partial-and-enlarged perspective view of a brush member.

In the shown embodiment, the scrub cleaner 23 has the "thready" brush members 46 of equal lengths tied up in a bundle and also supported by the body 45 through their upper ends, forming a so-called brush. As shown in FIG. 6, each of the brush members 46 is hollow-shaped, at a substantial center thereof, with a passage 50 for the cleaning liquid. The brush member 46 is made of water permeable material allowing the cleaning liquid flowing in the passage 50 to be ejected from the surface of the member 46.

Further, in order to allow particles etc., which have been peeled off the wafer W, to be shed together with pure water, the brush member 46 is also made of water-repellent material (resin etc.). As the material for the brush members 46, for example, polypropylene (PP) is appropriate.

As shown in FIGS. 2 and 3, a nozzle 61 is fitted to the underside of a leading end of the nozzle arm 60. Owing to the pivotal movement of the nozzle arm 60, the nozzle 61 is capable of reciprocating from the external position outside the spin chuck 21 to the substantial center of the wafer W held by the spin chuck 21 and vice versa. Note, FIG. 2 shows a stand-by condition that results from the moving the nozzle 61 to the outside of the spin chuck 23 due to the pivotal motion of the nozzle arm 60, while FIG. 3 shows a cleaning condition that results from the moving the nozzle 61 to the upside of the wafer W held by the spin chuck 23 due to the pivotal motion of the nozzle arm 60. Owing to the provision of the nozzle 61, it is possible to supply the back face of the wafer W with the cleaning water, such as pure water.

The cleaning system 1 constructed above operates as follows. First, a not-shown transfer robot mounts the carrier C having the wafers W (e.g. 25 pieces of wafers) accommodated therein, on the mounting section 2. Next, the wafers W are taken out from the carrier C and delivered to the transfer arm 4 by the manipulating arm 3, one by one. By using the substrate cleaning apparatus 7 and the substrate cleaning apparatus 8, the wafers W are cleaned one by one, in order to remove particles, such as particle contaminants, from the front and back faces of the wafer W. The wafer W after completing a designated cleaning process is delivered from the transfer arm 4 to the manipulating arm 3 and subsequently accommodated in the carrier C again.

Hereat, the operation of the substrate cleaning apparatus 8 to clean the back face of the wafer W will be described in detail. The wafer W turned upside down by the reversing units 10 is firstly loaded into the substrate cleaning apparatus 8 and supported by the spin chuck 21. Next, the wafer W is rotated by a not-shown motor and thereafter, the nozzle arm 60 is rotated to move the nozzle 61 to the upside of the wafer W, supplying the back face of the wafer W with the cleaning liquid, such as pure water.

Further, the scrub arm 24 is rotated to move the scrub cleaner 23 to the upside of the wafer W. Then, the cleaning liquid, such as pure water, is supplied from the cleaning liquid passage 43 to the scrub cleaner 23. In the scrub cleaner 23, the cleaning liquid supplied into the body 45 is supplied toward the brush members 46 uniformly, so that the cleaning liquid in the passages 50 is ejected from both surfaces and lower ends of the brush members 46. Then, with the drive of the elevating-and-rotating mechanism 41, the scrub cleaner 23 is lowered to make the respective brush members 46 in contact with the back face of the wafer W with the designated contact pressure and further rotated about the elevator shaft 42. Thus, since the rotating scrub cleaner 23 with the rotation of the scrub arm 24 reciprocates between at least the center of the rotating wafer W and its periphery, the whole back face of the wafer W is scrubbed. In this way, it is possible to clean the whole back face of the wafer W uniformly with the effective removal of the particles etc.

In the scrub cleaner 23, since the cleaning liquid passing through the passages 50 of the brush members 46 is ejected to the wafer W through the lowermost ends of the members 46, the contaminants, such as particles, removed from the wafer W are washed away. Further, since the brush members 46 are made of water-permeable material, the cleaning liquid in the passages 50 is also ejected from the surfaces of the members 46, so that there is no fear of sticking of the particles etc. to the surfaces of the members 60. Then, being made of water-repellent material, the shown brush members 46 is capable of shedding the particles etc. together with the cleaning liquid, ensuring the prevention the particles etc. from sticking to the members 46. In this way, without transferring (re-sticking) the particles etc. from the brush members 46 to the wafer W, it is possible to clean the back face of the wafer W appropriately.

After completing the scrub cleaning by using the scrub cleaner 23, the cleaning liquid, such as pure water, is ejected from the nozzle 61 to rinse the wafer W. Thereafter, the revolution of the not-shown motor is elevated to rotate the wafer W supported by the spin chuck 21, at high speed, thereby to shake the cleaning liquid off the wafer W in the spin drying. Subsequently, the wafer W subjected to the designated cleaning process is delivered from the transfer arm 4 to the manipulating arm 3 and therefore accommodated in the carrier C.

According to the substrate cleaning apparatus 8 of the embodiment, with the prevention of transferring the particles, it is possible to improve the cleaning efficiency, thereby shortening the cleaning time. Additionally, since the contaminants, such as particles, are hard to adhere to the brush members 46, they are not contaminated in spite of the cleaning process, so that the cleanness can be maintained for a long term. Since the brush members 46 come into soft contact with the wafer W while ejecting the cleaning liquid, both wear and damage to the brush members 46 are so small that the product life of the scrub cleaner 23 is extended, whereby the cycle of maintenance, such as exchange of components, becomes longer. Additionally, owing to the smooth contact between the wafer W and the scrub cleaner 23, it is possible to perform the cleaning process appropriately without damaging the wafer W.

Figure 7:
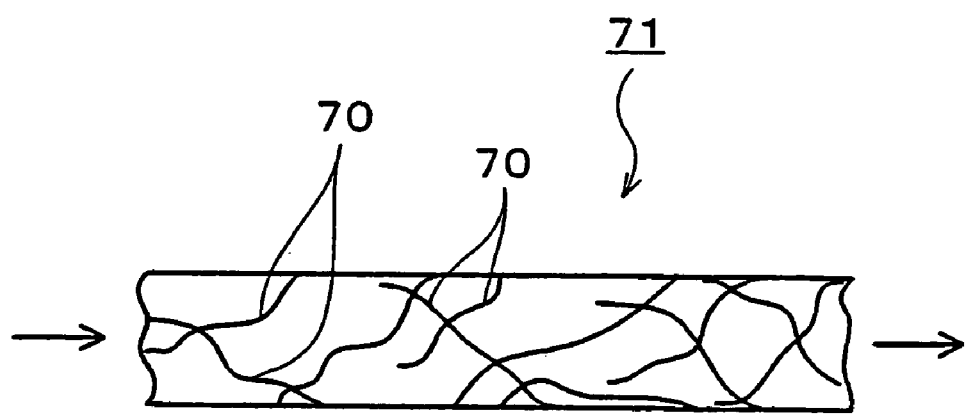
FIG. 7 is a partial-and-enlarged view showing another embodiment of the brush member.

The present invention is not limited to the above-mentioned embodiment only. For example, the brush member 46 shown in FIG. 6 may be replaced with a brush member 71 having a number of channels 70, 70, 70. for passage of the cleaning liquid, as shown in FIG. 7. Then, the brush member 71 is capable of ejecting the cleaning liquid through the channels 70 thereby to take the similar effect.

Additionally, without being limited to water repellent finishing only, the brush member 46 and the brush member 71 may be subjected to water-intimate finishing by immersing these members in alcohol, for example. In such a case, it becomes easy to eject the cleaning liquid through the whole surfaces of the brush members 46 and 71, facilitating wash-away of the contaminants.

Although the brush members 46 of FIG. 5 are of the same length, the same members may be modified to be irregular in length. In a scrub cleaner 80 of FIG. 8, the brush members 46 and 46' of different length are attached to the lower face of the body 45 by turns. Each short brush member 46' is disposed between the adjoining brush members 46 and 46. The structure of the scrub cleaner 80 is similar to that of the afore-mentioned scrub cleaner 23 of FIG. 5 besides the above-mentioned arrangement of the brush members 46, 46. Therefore, elements of FIG. 8 in common with those of FIG. 5 are respectively indicated with the same reference numerals and their overlapping descriptions are eliminated. In the scrub cleaner 80 of FIG. 8, the cleaning operation is carried out by contact of the brush members 46 with the back face of the wafer W. Then, in addition to the ejection of the cleaning liquid through the surfaces of the brush members 46, it is possible to flow down the cleaning liquid, which has been ejected from the short brush members 46', along the long brush members 46, thereby washing away the particles being about to adhere to the surfaces of the brush members 46.

Figure 8:
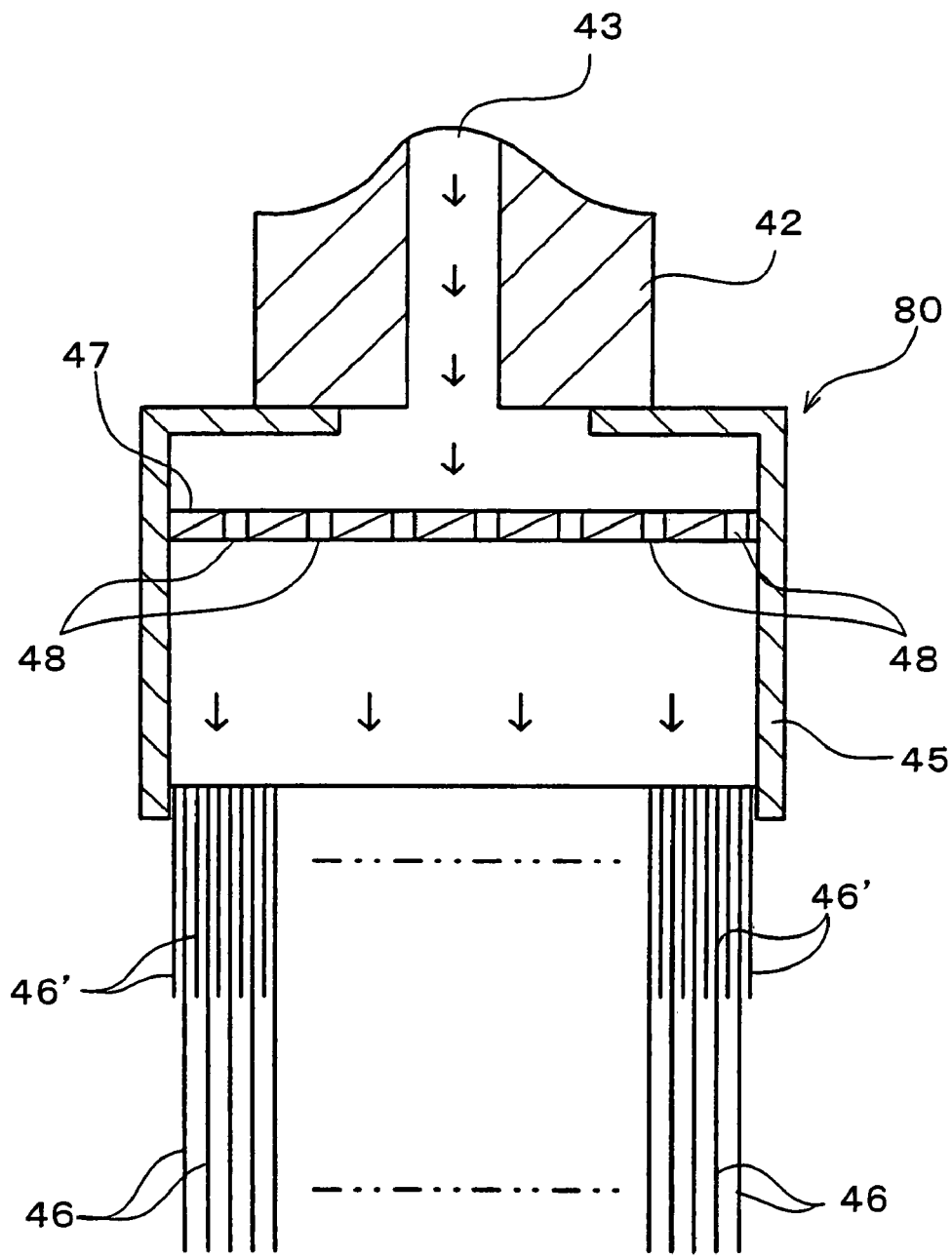
FIG. 8 is a longitudinal sectional view of the scrub-cleaning tool of the other embodiment of the present invention.
Figure 9:
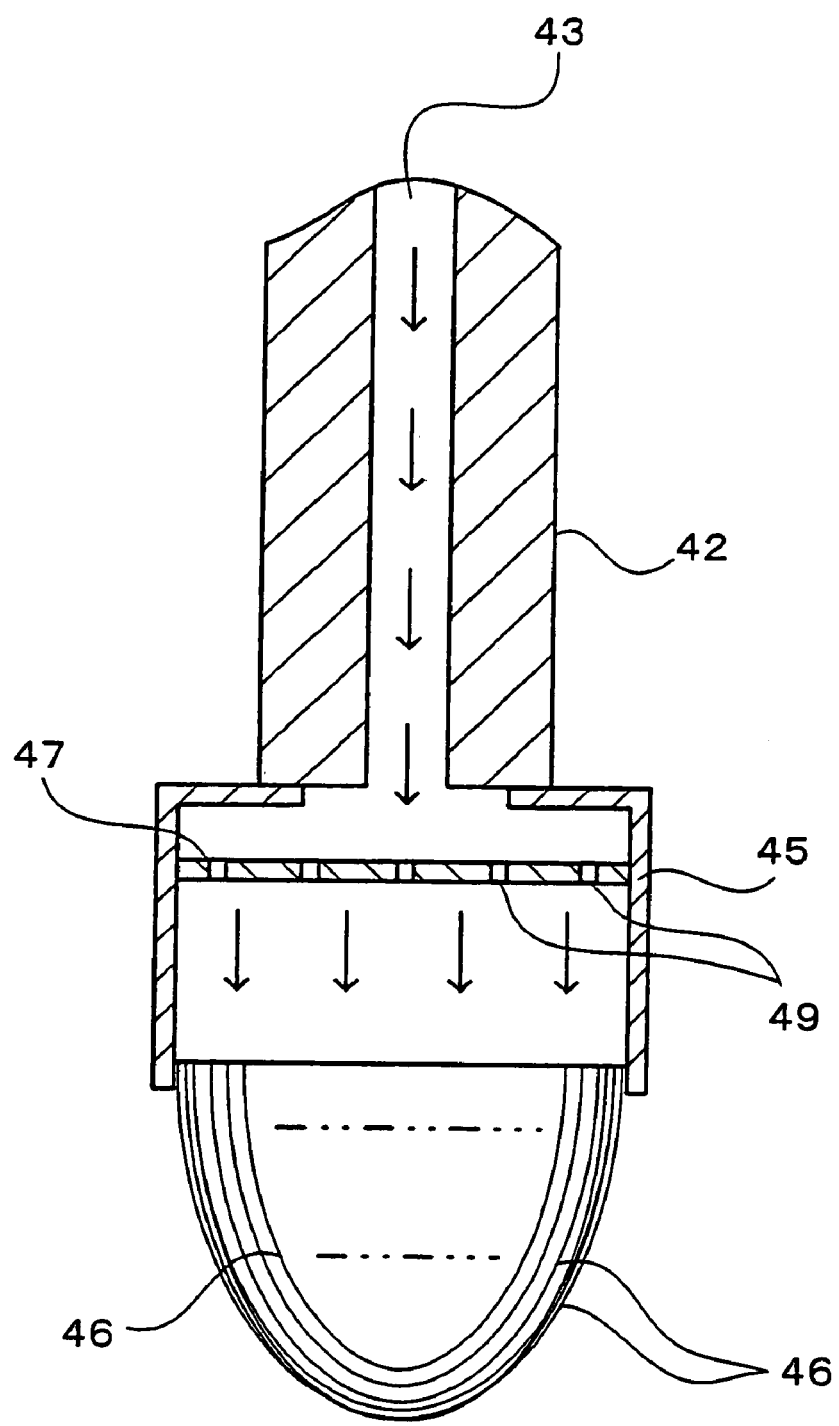
FIG. 9 is a longitudinal sectional view of the scrub cleaning tool in the form of loops, in accordance with the other embodiment.
Figure 10:
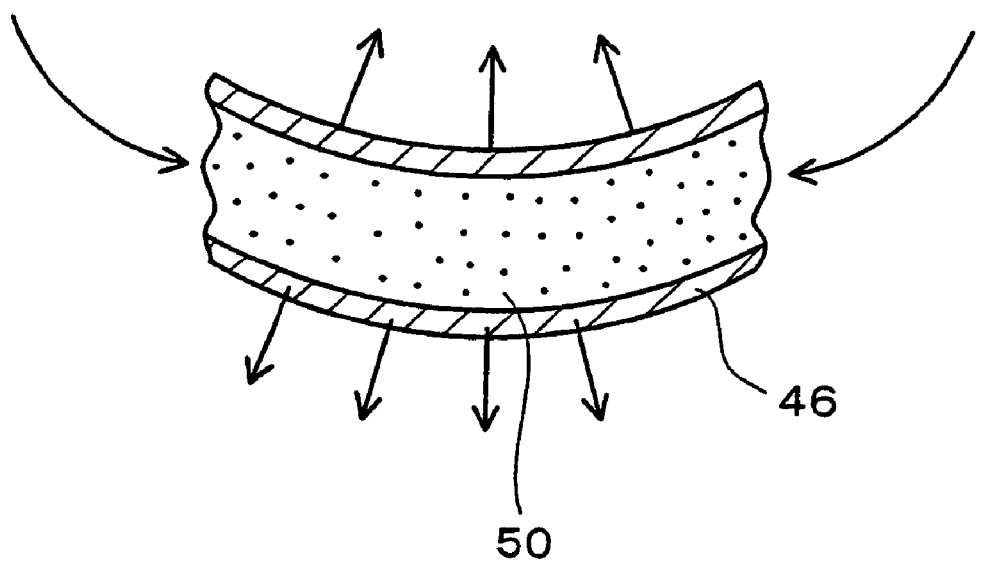
FIG. 10 is a partial-and-enlarged sectional view of the loop-shaped brush member.

In common with the scrub cleaners of FIGS. 5 and 8, the top ends of the brush members 46, 46' are tied up in a bundle and supported by the body 45. As shown by a scrub cleaner 90 of FIG. 9, the brush members 46 may be curved to make loops in the modification. Then, the respective both ends of the brush members 46 are tied up in a bundle and supported on the lower face of the body 45. Note, the structure of the scrub cleaner 90 is similar to that of the afore-mentioned scrub cleaner 23 of FIG. 5 besides the above-mentioned form of the brush members 46. Therefore, elements of FIG. 9 in common with those of FIG. 5 are respectively indicated with the same reference numerals and their overlapping descriptions are eliminated. According to the scrub cleaner 90, since the cleaning liquid supplied into the body 45 through the cleaning liquid passage 43 flows into the passage 50 via both ends of each brush member 46 in loop, a hydraulic pressure in the passage 50 is so raised that more cleaning liquid can be ejected from the surfaces of the water-permeable brush members 46, as shown in FIG. 10. Therefore, by washing the surfaces of the brush members 46 certainly, it is possible to prevent the sticking of particles etc. furthermore. Additionally, it is more preferable that, even at the stand-by state, the brush members 46 ejects the cleaning liquid to clean their surfaces, in other words, self-cleaning. Further, if reducing the quantity of cleaning liquid spouted at the stand-by state in comparison with that at the formal cleaning operation, then it is possible to save the consumption of the cleaning liquid.

Besides the pure water as the cleaning liquid, there may be employed, for example, ozone water, electrolyzed ion water, hydrochloric peroxide mixture, ammonium peroxide mixture, phosphoric acid solution, fluoride acid solution, etc. in order to enhance the cleaning effect or attain a variety of cleaning effects. For example, when etching an oxidized layer by fluoride acid solution or etching a nitrogen layer by phosphoric acid solution, the present invention is applicable to a cleaning process following the etching process of aluminum by a mixture of phosphoric acid, acetic acid and nitric acid. As to other cleaning processes, the present invention is further applicable to various cases of: removing the particles by using APM solution (ammonia+hydrogen peroxide water+pure water); cleaning metallic contamination by HPM solution (hydrochloric acid+hydrogen peroxide water+pure water) and so on.

Alternatively, the substrate cleaning apparatus of the invention is also capable of cleaning the wafer W without rotating the scrub cleaner 23 but only contacting with the wafer W. The scrub cleaner of the invention is applicable to a substrate cleaning apparatus for cleaning the back surface of the wafer W and also a substrate cleaning apparatus for cleaning both front and back surfaces of the wafer W at the same time. Besides the wafers as the object to be cleaned, the present invention is applicable to the cleaning process for other substrates, for example, LCD substrates, CD substrates, printed baseplates, ceramic substrates, etc.

According to the present invention, it is possible to cleaning the substrates with no transferal of contaminants, such as particles, whereby the cleaning efficiency can be improved with the reduction of cleaning period. In addition, the cycle of maintenance can be elongated thereby to improve the operational efficiency. The preferable cleaning can be effected without causing damage to the substrates. Furthermore, owing to an incidental effect of the brush members to filter the cleaning liquid, they can spout the cleaned cleaning liquid against the substrates.

What is claimed is:

1. A substrate cleaning tool for cleaning a substrate, comprising:
    a plurality of flexible thready members, wherein
    each of the members has a hollow channel and comprises a water permeable material,
    the members extend straight and have their respective one ends tied up in a bundle,
    the members are attached to a body, the body having a cleaning liquid passage for supplying the cleaning liquid to the members,
    members of a first group of the members are longer than members of a second group of the members;
    members of the second group are disposed between members of the first group; and
    the substrate is a semiconductor wafer or a LCD substrate glass.

2. A substrate cleaning tool as claimed in claim 1, wherein the substrate cleaning tool is capable of rotating against the substrate.

3. A substrate cleaning tool as claimed in claim 1, wherein each of said members has a number of channels extending from the hollow channel.

4. A substrate cleaning tool as claimed in claim 1, wherein the members comprise a hydrophilic material.

5. A substrate cleaning tool for cleaning a substrate, comprising:
    a plurality of flexible thready members, wherein
    each of the members has a hollow channel and comprises a water repellant material,
    the members extend straight and have their respective one ends tied up in a bundle,
    the members are attached to a body, the body having a cleaning liquid passage for supplying the cleaning liquid to the members,
    members of a first group of the members are longer than members of a second group of the members
    members of the second group are disposed between members of the first group; and the substrate is a semiconductor wafer or a LCD substrate glass.

6. A substrate cleaning apparatus for cleaning a substrate, comprising:

a substrate cleaning tool comprising a plurality of flexible thready members;

a scrub arm for holding the substrate cleaning tool; and a holder for holding a substrate to be cleaned by the substrate cleaning tool, wherein each of the members has a hollow channel and comprises a water permeable material, the members extend straight and have their respective one ends tied up in a bundle and attached to a body, the body having a cleaning liquid passage for supplying the cleaning liquid to the members, members of a first group of the members are longer than members of a second group of the members members of the second group are disposed between members of the first group; and the substrate is a semiconductor wafer or a LCD substrate glass.

7. A substrate cleaning apparatus as claimed in claim 6, wherein the scrub arm is provided with a driving mechanism for driving the substrate cleaning tool.

8. A substrate cleaning apparatus as claimed in claim 7, wherein the driving mechanism moves the substrate cleaning tool up and down.

9. A substrate cleaning apparatus as claimed in claim 7, wherein the driving mechanism rotates the substrate cleaning tool.

10. A substrate cleaning apparatus as claimed in claim 7, wherein the driving mechanism moves the substrate cleaning tool up and down and also rotates the substrate cleaning tool, the driving mechanism being provided with an elevator shaft being moved up and down and rotated, the elevator shaft being provided with a cleaning liquid passage therethrough for supplying the cleaning liquid to the substrate cleaning tool and being provided with a body at a lower end thereof, the members extending straight and having their respective one ends tied up in a bundle and mounted on the body.

11. A substrate cleaning apparatus as claimed in claim 6, wherein the holder holds the substrate rotatably.

12. A substrate cleaning apparatus as claimed in claim 6, further comprising a nozzle for ejecting cleaning liquid for rinsing.

the substrate is a semiconductor wafer or a LCD substrate glass.

13. A substrate cleaning apparatus for cleaning a substrate, comprising:

a substrate cleaning tool comprising a plurality of flexible thready members;

a scrub arm for holding the substrate cleaning tool; and a holder for holding a substrate to be cleaned by the substrate cleaning tool, wherein each of the members has a hollow channel and comprises a water repellant material, the members extend straight and have their respective one ends tied up in a bundle and attached to a body, the body having a cleaning liquid passage for supplying the cleaning liquid to the members, members of a first group of the members are longer than members of a second group of the members members of the second group are disposed between members of the first group; and the substrate is a semiconductor wafer or a LCD substrate glass.

* * * * *